(12) United States Patent
Yu

(10) Patent No.: US 7,623,782 B2
(45) Date of Patent: Nov. 24, 2009

(54) POSITIONING A FLEXIBLE PRINTED CIRCUIT BOARD IN A MOBILE TELECOMMUNICATION TERMINAL

(75) Inventor: Jae-Wook Yu, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 385 days.

(21) Appl. No.: 11/457,724

(22) Filed: Jul. 14, 2006

(65) Prior Publication Data
US 2007/0014569 A1   Jan. 18, 2007

(30) Foreign Application Priority Data
Jul. 14, 2005   (KR) .................. 10-2005-0063824

(51) Int. Cl.
*G03B 17/00* (2006.01)
(52) U.S. Cl. .................. 396/542; 361/749; 348/376
(58) Field of Classification Search .............. 396/542; 361/749; 174/254; 348/376
See application file for complete search history.

(56) References Cited

U.S. PATENT DOCUMENTS

| | | | |
|---|---|---|---|
| 5,134,252 A | | 7/1992 | Himeno et al. |
| 5,758,208 A | * | 5/1998 | Fujii et al. ................ 396/87 |
| 6,118,072 A | * | 9/2000 | Scott .................... 174/525 |
| 6,290,532 B1 | | 9/2001 | Vermeersch |
| 6,447,315 B1 | | 9/2002 | Pan et al. |
| 6,665,455 B1 | * | 12/2003 | Ting ....................... 382/312 |
| 6,829,490 B2 | | 12/2004 | Nakamura |
| 7,184,808 B2 | * | 2/2007 | Shoji ..................... 455/575.7 |
| 7,193,653 B2 | * | 3/2007 | Lee ........................ 348/373 |
| 7,269,442 B2 | * | 9/2007 | Sato et al. ............... 455/556.1 |
| 7,392,072 B2 | * | 6/2008 | Im ........................ 455/575.3 |
| 2001/0036845 A1 | * | 11/2001 | Park ....................... 455/566 |
| 2002/0135993 A1 | | 9/2002 | Ueyama |
| 2003/0193772 A1 | | 10/2003 | Thomason |
| 2004/0266239 A1 | | 12/2004 | Kurokawa |
| 2006/0033832 A1 | * | 2/2006 | Shin ....................... 348/335 |

* cited by examiner

*Primary Examiner*—WB Perkey
*Assistant Examiner*—Linda B Smith
(74) *Attorney, Agent, or Firm*—Lee, Hong, Degerman, Kang & Waimey

(57) ABSTRACT

A mobile communication terminal comprising a first unit comprising a circuit; a second unit comprising a rotating camera module; and a flexible printed circuit board connecting said circuit to said rotating camera module. The rotating camera module comprising a first peg forming a first turning point for said flexible circuit board to wind around in a first direction, wherein a wound path of said flexible circuit board around said first turning point virtually divides said flexible circuit board into a first region and a second region, said first region being defined by a first portion of said flexible circuit board extending from a connection point to said rotating camera module to said first peg, said second region being defined by a second portion of said flexible circuit board extending from said first peg to an area above said connection point.

13 Claims, 5 Drawing Sheets

POSITIONING A FLEXIBLE PRINTED CIRCUIT BOARD IN A MOBILE TELECOMMUNICATION TERMINAL

CROSS-REFERENCE TO RELATED APPLICATIONS

Pursuant to 35 U.S.C. § 119(a), this application claims the benefit of earlier filing date and right of priority to Korean Patent Application No. 10-2005-0063824, filed on Jul. 14, 2005, the content of which is hereby incorporated by reference herein in its entirety.

FIELD OF THE INVENTION

The present invention relates to a mobile telecommunication handset, and more particularly to a system and method for positioning a flexible printed circuit board in a mobile telecommunication handset.

BACKGROUND

A mobile telecommunication handset (hereinafter referred to as a mobile handset), which provides wireless voice and data communication on the move, traditionally provides a multimedia application where the subscriber may watch an audio or a video presentation and may click an input device to direct the presentation. Also, mobile handsets with a built-in camera are popular for use in photographing an object or recording video media and storing or transmitting the captured media as electronic information. The camera in the mobile handset is sometimes rotatable to allow a user to point the camera lens at the object to capture an image. The captured image is traditionally sent through a flexible printed circuit board (FPCB) from the built-in camera to a main circuit of the mobile handset.

As the length of the FPCB gets shorter, the radio frequency reception gets poorer and a rotation angle of the camera gets smaller, which makes it difficult to focus the object through the display of the mobile handset. A long FPCB is necessary to remedy these problems, which provides more than 5 dB signal-to-noise ratio, compared to a short FPCB.

One method of using a long FPCB is to wind the FPCB in one direction twice along the outside surface of a protruding longitudinal opening formed on a cap. This increases noise level, unfortunately. Methods and systems are needed to overcome this shortcoming.

SUMMARY

In accordance with one aspect of the invention, a camera module in a mobile telecommunication handset is provided. The camera module comprises a camera; a circuit; and a flexible printed circuit board connecting said camera to said circuit. The flexible printed circuit board comprises a first region and a second region. The first and second regions are positioned such that a direction of current flowing over said first region is opposite to a direction of current flowing over said second region to form a virtual grounding between the first region and the second region. Different sections of said flexible printed circuit board are wound in opposite directions to create a plurality of virtual groundings.

The camera module may further comprise a rotating element, wherein said flexible printed circuit board is wound on said rotating element to maintain said virtual grounding. The flexible printed circuit board wraps around said rotating element as said rotating element rotates. Direction of current flowing over an outside section of said flexible printed circuit board is opposite to a direction of current flowing over an inside section of said flexible printed circuit board, creating an additional virtual grounding.

The rotating element further comprises a protruding hook to prevent said rotating element from rotating beyond a certain position. In one embodiment, the rotating element further comprises a groove creating added traction to a surface of said rotating element to allow a user rotate said rotating element. Preferably, the rotating element is attached to the camera to allow the camera to rotate. In another embodiment, the rotating element further comprises a peg around which said flexible printed circuit board is wound, and an indicator showing a preferred path around said peg for said flexible printed circuit board. The indicator may comprise a groove, such that the flexible printed circuit board is positioned in said groove.

In accordance with another aspect of the invention, a camera module provided in a mobile telecommunication handset, comprises a rotation-enabled camera housing; a camera attached to said rotation-enabled camera housing; a circuit; a connection line connecting said circuit to said camera; and a cap attached to said rotation-enabled camera housing, wherein said connection line is wound around said cap. The cap comprises a first peg, wherein said connection line is wound around said first peg in a first direction. The cap may further comprise a second peg, wherein said connection line is wound around said second peg in a second direction, Preferably, the connection line is wound clockwise around said first peg, and said connection line is wound counterclockwise around said second peg, for example.

In accordance with yet another aspect of the invention, a mobile communication terminal comprises a first unit comprising a circuit; a second unit comprising a rotating camera module; and a flexible printed circuit board connecting said circuit to said rotating camera module. The rotating camera module comprises a first peg forming a first turning point for said flexible circuit board to wind around in a first direction, wherein a wound path of said flexible circuit board around said first turning point virtually divides said flexible circuit board into a first region and a second region.

The first region is defined by a first portion of said flexible circuit board extending from a connection point to said rotating camera module to said first peg. The second region is defined by a second portion of said flexible circuit board extending from said first peg to an area above said connection point, wherein a direction of a current in said first region is opposite a direction of a current in said second region, creating a first virtual grounding.

In one embodiment, the rotating camera module may further comprise a second peg forming a second turning point for said flexible circuit board to wind around in a second direction, wherein said wound path of said flexible circuit board around said second turning point virtually divides said flexible circuit board into a third region and a fourth region. The third region is defined by a third portion of flexible circuit board extending from a said area above said connection point to said second peg. The fourth region is defined by a fourth portion of flexible circuit board extending from said second peg to said first unit, wherein a direction of a current in said third region is opposite a direction of a current in said fourth region, creating a second virtual grounding.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF PREFERRED EMBODIMENTS

Figure 1:
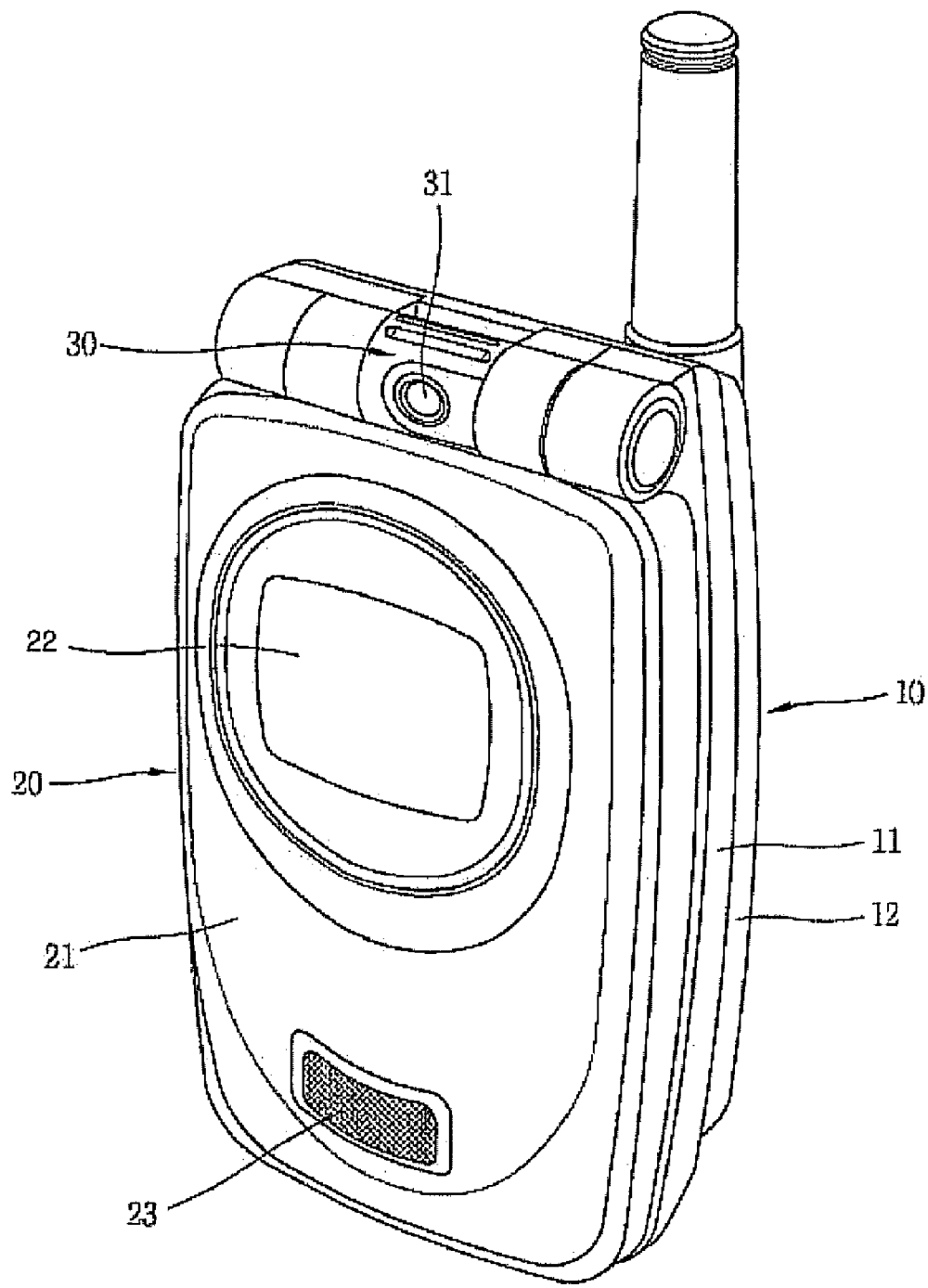
FIG. 1 is a perspective view of a mobile telecommunication handset having a rotation-enabled camera according to one embodiment.

Referring to FIG. 1, a mobile telecommunication handset in accordance with the present invention comprises a first body 10 capable of visual telecommunication, a second body 20 rotatably coupled to first body 10, and a camera 30 with a converging lens 31, rotatably provided on first body 10 in a manner to focus lens 31 towards an object.

First body 10 comprises a first body housing 11 enclosing a circuit performing functions for telecommunication and a rechargeable battery 12 detachably provided on a back side of housing 11.

Second body 20 comprises a second body housing 21 for housing a main liquid crystal display (not shown) and an auxiliary liquid crystal display 22 provided on a front center side of second body housing 21. An opening 23 is provided on the front lower side of second body housing 21 to propagate a sound wave from a speaker provided inside first body housing 11.

Figure 2:
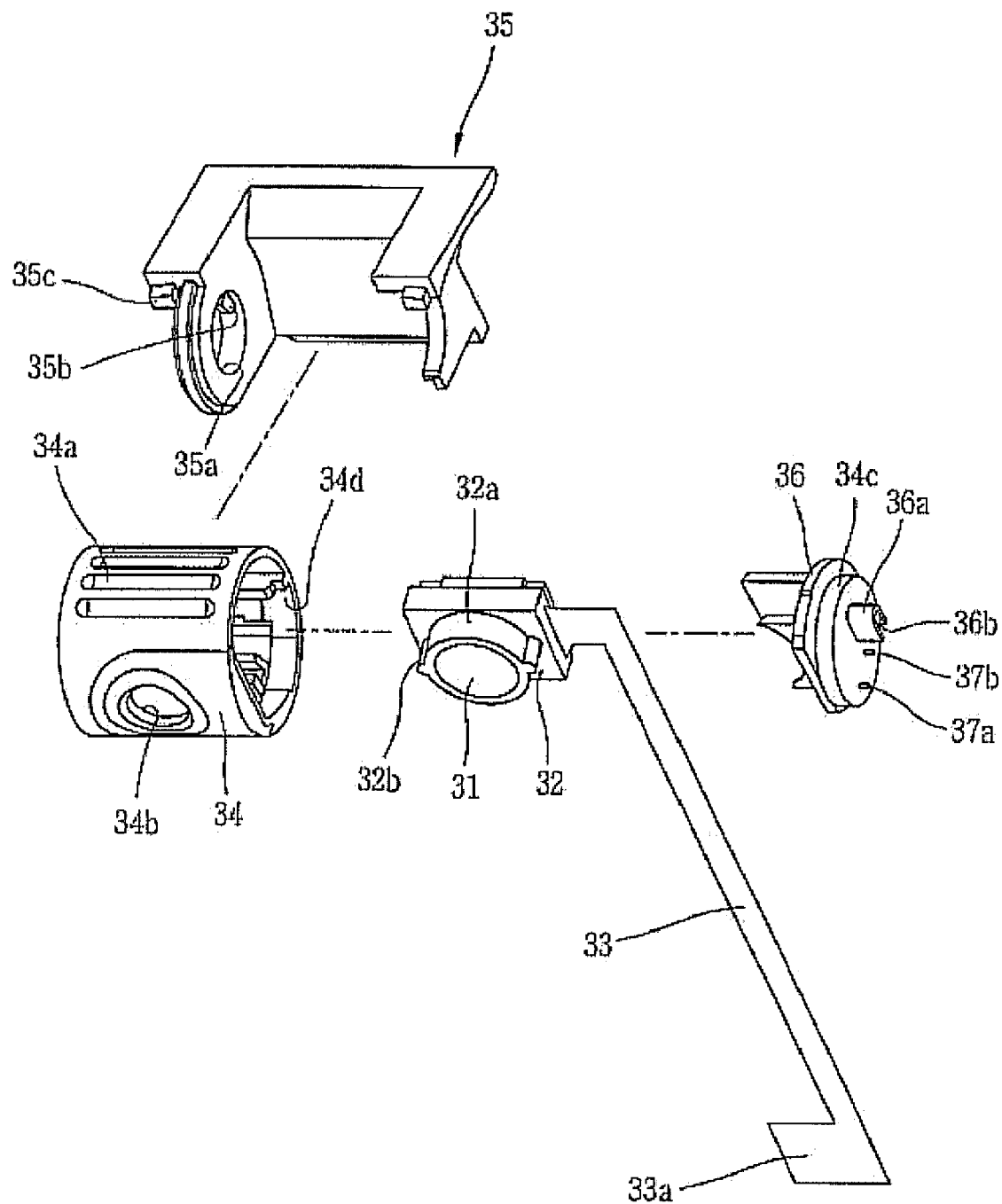
FIG. 2 is an exploded view of the rotation-enabled camera of FIG. 1, in accordance with one embodiment.

Referring to FIG. 2, camera 30 comprises a converging lens 31 causing incident light rays initially parallel to a central axis to converge, a camera module 32 which senses and processes light intensities across a plane of focus of camera lens 31, an FPCB 33 through which a signal from a camera module may be transmitted to a circuit (not shown), a rotation-enabled camera housing 34, and a cap 36.

Cap 36 closes opening 34d of rotation-enabled camera housing 34 after camera module 32 is inserted into rotation-enabled camera housing 34. A camera housing support 35 on which a rotation axis opening 35a is formed is provided to support the rotation of rotation-enabled camera housing 34. As shown, rotation disk 34c is formed on one side of cap 36 through opening 34d of rotation-enabled camera housing 34.

The converging lens 31 causes incident light rays initially parallel to a central axis to converge. A lens frame 32a is formed to enclose converging lens 31, and a pair of protruding regions 32b are formed on both lateral sides of lens frame 32a to fix camera module 32 inside rotation-enabled camera housing 34.

Rotation-enabled camera 30 can be rotated at an angle of 120 degrees, for example, so that converging lens 31 may be accordingly pointed towards an object and viewed through a main liquid crystal display (not shown) on a mobile telecommunication handset. FPCB 33, which is durable and relatively long to prevent tension, is wound, preferably at least twice, around an outside surface of a protruding longitudinal bend 36b formed on the cap 36.

One end of FPCB 33 is connected to one side of camera module 32 and other end 33a is connected to a circuit (not shown) of the mobile telecommunication handset. Accordingly, FPCB 33 serves as a conduit along which current and information flows from a circuit of the mobile telecommunication handset (not shown) to camera module 32.

Evenly spaced horizontal grooves 34a are formed on an outside surface of the rotation-enabled camera housing 34, creating added traction to help a user rotate the rotation-enabled camera housing. The rotation-enabled camera housing 34 has an inner cylindrical space with opening 34d on a lateral side, into which camera module 32 is inserted. An opening 34b for converging lens 31 is formed on an outside surface of tie rotation-enabled camera housing 34.

Rotation-enabled camera housing support 35 comprises a rotation axis opening 35a into which rotation disk 34c of rotation-enabled camera housing 36 is inserted. A protruding region 35b is formed on an inside surface of rotation axis opening 35a to limit a rotation angle of rotation-enabled camera housing 34. In one embodiment, a position guide region 35c is formed to couple camera 30 to the first body 10.

Cap 36 comprises a rotation disk 34c, outside surface 36a for a protruding longitudinal opening 36b. Cap 36 has a first peg 37a and a second peg 37b around which FPCB 33 turns. That is, the first and second pegs 37a and 37b upon which FPCB 33 wraps around, or a groove covering both sides of FPCB 33 to minimize electromagnetic interference (EMI) and noise, may be formed on a surface of a lateral side of the rotation disk 34c.

Figure 3:
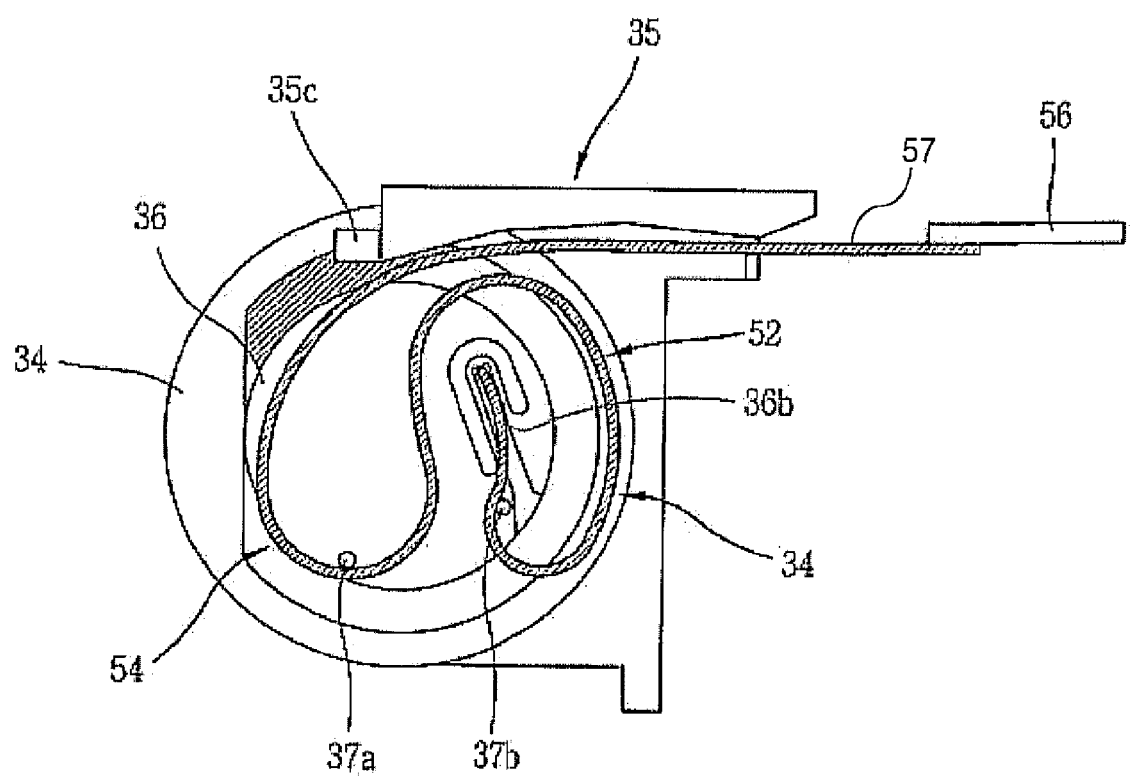
FIG. 3 is a view showing an embodiment in which the FPCB is positioned in the mobile telecommunication handset according to one embodiment.
Figure 4:
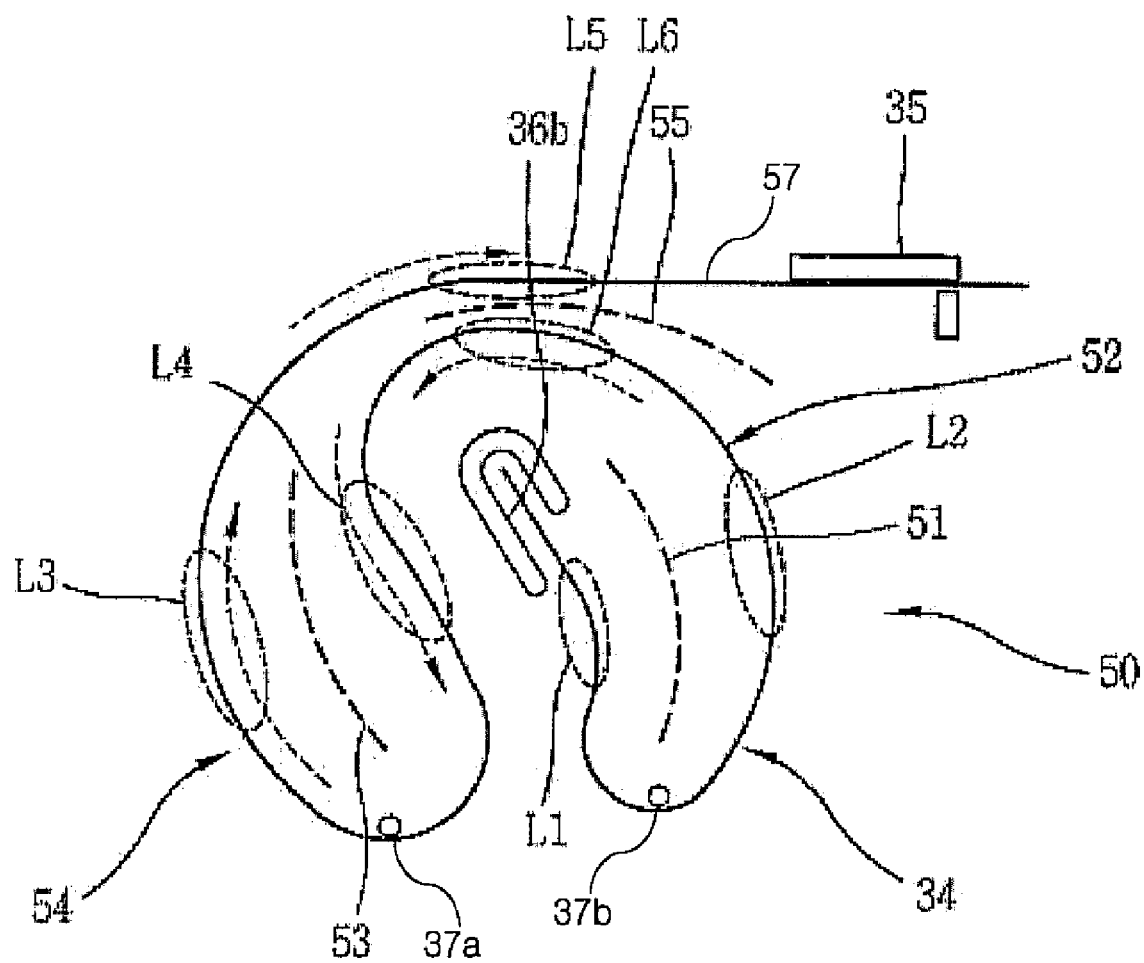
FIG. 4 is a schematic view showing how the FPCB is wound in accordance with one embodiment.

Referring to FIGS. 2, 3 and 4, one end of FPCB 33 is fixed to camera module 32 and is inserted into rotation-enabled camera housing 34. Preferably, the FPCB 33 is placed in cap 36 such that it protrudes from protruding longitudinal opening 36b, as shown. FPCB 33 protrudes from protruding longitudinal opening 36b and is wound around second peg 37b in a preferably counterclockwise direction. Thereafter, FPCB 33 is wound around first peg 37a in preferably a clockwise direction. In one embodiment, another end of FPCB 33 is wound, for example, two times along outside surface 36a of protruding longitudinal opening 36b before it is connected to a circuit (not shown) in first body 10.

FPCB 33 is preferably divided into three regions depending on the winding direction: a first winding region 52, a second winding region 54, and a non-winding region 57. First winding region 52 is formed when FPCB 33 is wound (e.g., counterclockwise) around second peg 37b positioned near protruding longitudinal opening 36b. Second winding region 54 is formed when FPCB 33 is wound (e.g., clockwise) around second peg 37a positioned near protruding longitudinal opening 36b. As such, FPCB 33 follows a preferred winding path, starting from protruding longitudinal opening 36b and ending at connector 56, around cap 36. In an exemplary embodiment, cap 36 may comprise a groove within which FPCB 33 follows.

FIG. 4 is a schematic view showing how the FPCB is wound in accordance with one embodiment. In the first winding region 52, direction of current flowing over a first signal line L1 is opposite to that of current flowing over a second line L2. As a result, a potential difference is zero between first and second lines L1 and L2, thus forming a first virtual grounding 51.

In the second winding region 54, direction of current flowing over a third signal line L3 is opposite to that of current flowing over a fourth line L4 corresponding to a point where first winding region 52 transitions to second winding region 54. As a result, the potential difference is zero between third and fourth lines L3 and L4, thus forming a second virtual grounding 53.

In one embodiment, non-winding region 57 is a continuation of second winding region 54, which in turn is a continuation of first winding region 52. Non-winding region 57, preferably, is in approximately a straight line along a camera housing support 35. A connector 56 is provided on an end of non-winding region 57, which is connected to the circuit (not shown). In non-winding region 57, a direction of current flowing over a fifth signal line L5 is opposite to that of current flowing over a sixth line L6. As a result, potential difference is zero between the fifth and sixth lines L5 and L6, forming a third virtual grounding 55.

Accordingly, the direction of current on outside section of FPCB 33 is opposite to a direction of current flowing over an inside section of FPCB 33. Preferably, the direction of current from L5 to camera housing support 35, in one embodiment, runs towards camera housing support 35, while the direction of current from L2 runs towards L6. Thus, as cap 36 rotates counterclockwise and FPCB wraps around cap 36 even more, third virtual grounding 55 expands in length, further decreasing potential noise. In a certain embodiment, protruding region 35b prevents non-winding region 57 from wrapping around cap 36 past first peg 37a so as to prevent directions of current from enhancing each other.

First winding region 52 is formed as a result of winding FPCB 33 in a first direction (e.g., counterclockwise) and second region 54 is formed as a result of winding FPCB 33 in a second direction (e.g., clockwise). Signal lines L2, L4, and L5 and signal lines L1, L3, and L5 are symmetrical with respect to the first, second, and third virtual groundings 51, 53 and, 54, respectively. The direction of current flowing on signal lines L2, L4, and L6 are opposite to that of current flowing on signal lines L1, L3, and L5, thus resulting in their respective potential differences being offset and the directions of the magnetic fields being the same. This is known as the odd mode.

Thus, in one embodiment, FPCB 33 is arranged in such a manner that a direction of current flowing over one signal line is opposite to that of current flowing over an opposite signal line in first and second winding region 52 and 54, and non-winding region 57, This results in a potential difference in the two regions and causes the respective magnetic fields to cancel each other.

One end of FPCB 33 is connected to camera module 32. Another end of FPCB 33 protrudes from protruding longitudinal opening 36b and is wound in a manner to decrease noise. That is, FPCB 33 is wound in such a manner that first, second, and third virtual grounding 51, 53, and 55 are formed around the protruding longitudinal opening 36b.

This arrangement of FPCB 33 in a mobile telecommunication device makes it possible for a user to point camera tens 31 towards the user by rotating horizontal grooves 34a of rotation-enabled camera housing 34 with, for example, the user's finger towards an outside of second body 20 or towards an inside of second body 20 after swinging second body 20 open to make or receive a call. This allows user's image to be shown on the display of another party's mobile telecommunication handset over an air interface.

Thus, FPCB 33 with a relatively long length can be connected to camera module 32 to allow a user to freely point camera lens 31 towards an outside or an inside of a mobile telecommunication handset by rotating rotation-enabled camera housing 34.

Figure 5:
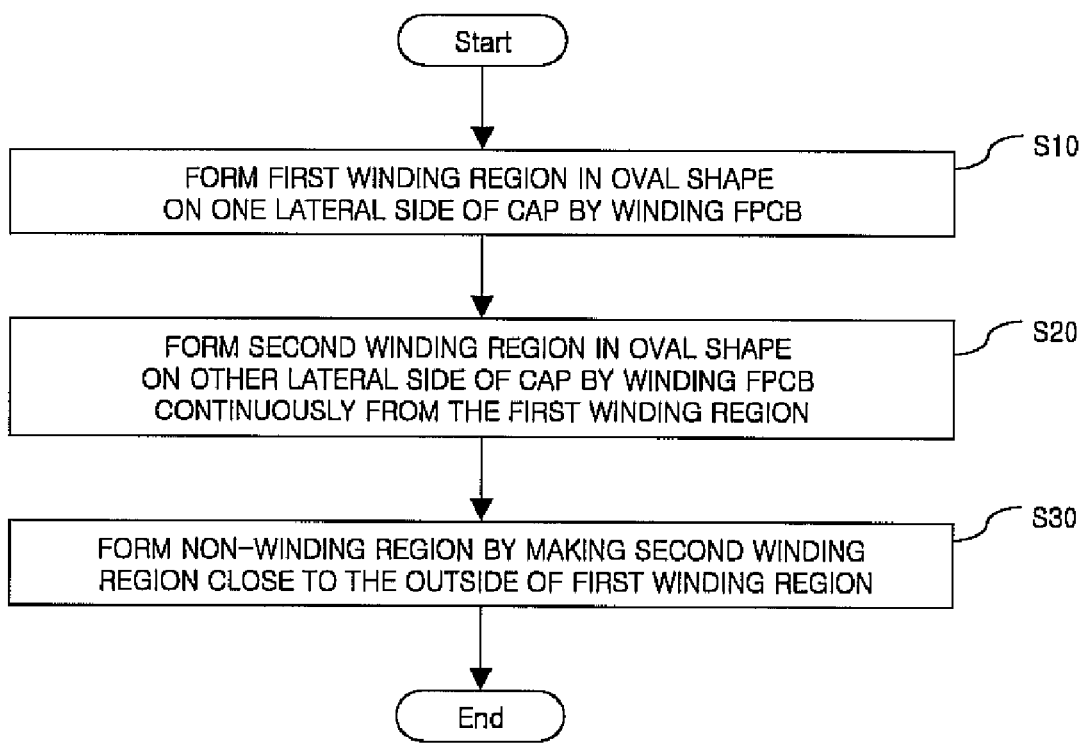
FIG. 5 is a flow diagram for a method of positioning a FPCB in a mobile telecommunication handset, in accordance with one embodiment, Reference will now be made in detail to embodiments of the present invention, examples of which are illustrated in the accompanying drawings. It is to be understood that other embodiments may be utilized and structural changes may be made without departing from the scope of the present invention.

Referring to FIGS. 4 and 5, a preferred method for positioning an FPCB is now described in detail FPCB 33 starts from a protruding longitudinal opening 36b, wraps around a second peg 37b and forms an oval-shaped first winding unit 52, such that a first winding region in oval shape is formed on one lateral side of cap 36 by the winding FPCB 33 (S10). This is known as an odd mode where a direction of current flowing over a left signal line L1 is opposite to a direction of current flowing over a right signal line L2. A first virtual grounding 51 is formed by potential difference between left and right signal lines L1 and L2.

FPCB 33 then wraps around a first peg 37a and forms a second winding region 54 on the other lateral side of cap 36, by winding FPCB 33 continuously from the first winding region 52, which is preferably oval-shaped (S20). This is also known as an odd mode where a direction of current flowing over a left signal line L3 is opposite to a direction of current flowing over a right signal line L4. A second virtual grounding 53 is formed by a potential difference between the left and right signal lines L3 and L4.

FPCB 33 then forms a non-winding region 57 by making the second winding region 54 close to the outside of the first winding region 52, which preferably extends along camera housing support 35 (S30). A connector 56 provided on an end of non-winding region 57 is connected to a circuit of a first body 10. A direction of current flowing over a fifth signal line L5 in non-winding region 57 is opposite to a direction of current flowing over a sixth signal line L6 in first winding region 52. Thus, a third virtual grounding 55 is formed by a potential difference halfway between fifth and sixth signal lines L5 and L6.

FPCB 33 is preferably long enough to connect camera module 32 to the circuit (not shown), for example, after forming first and second winding regions 52 and 54 without creating much noise. This makes it possible to rotate rotation-enabled camera housing 30 to freely point camera lens 31 to an outside or an inside of a mobile telecommunication handset when making or receiving a call. FPCB 33 is arranged in such a manner that a direction of current flowing over one signal line is opposite to a direction of current flowing over an opposite signal line in first and second winding regions 52 and 54, and non-winding region 57, thereby forming first, second, and third virtual groundings 51, 53, and 55. As a result, the directions of the magnetic fields are the same. This makes it possible to reduce noise in visual telecommunication.

As described above, FPCB 33, when provided on one rotation-enabled camera, can be arranged to have first and second winding regions 52 and 54 and non-winding region 57, depending on the length of the FPCB. This makes it possible to reduce noise and improve image quality. Furthermore, this design prevents noise, such as electromagnetic waves, from being introduced into the main antenna. This leads to an improvement of up to 3 dB in the signal-to-noise ratio over a mobile telecommunication handset with a conventional camera, which uses visual telecommunication.

Also, this design makes it possible to adjust the length of FPCB 33 connected to camera module 32 to obtain the same sensitivity, as well as prevent a breakage of FPCB 33 due to frequent bending. The wider rotation angle of the camera helps increase transmission and reception sensitivity of the antenna.

As the present invention may be embodied in several forms without departing from the spirit or essential characteristics thereof, it should also be understood that the above-described embodiments are not limited by any details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A camera module provided in a mobile telecommunication handset comprising:
   a camera;
   a circuit; and
   a flexible printed circuit board connecting said camera to said circuit, wherein said flexible printed circuit board is wound around a first peg and a second peg in opposite directions to create a plurality of virtual groundings, wherein said first and second pegs are formed on a cap attached to a rotation-enabled camera housing to provide a first turning point and a second turning point for said flexible printed circuit board.

2. The camera module of claim 1, wherein said flexible printed circuit board is wound clockwise around said first peg, and said flexible printed circuit board is wound counterclockwise around said second peg.

3. The camera module of claim 1, wherein said flexible printed circuit board is wound counterclockwise around said first peg, and said flexible printed circuit board is wound clockwise around said second peg.

4. The camera module of claim 1, wherein said cap further comprises an indicator showing a preferred path around said first and second pegs.

5. The camera module of claim 4, wherein said indicator comprises a groove, wherein said flexible printed circuit board is positioned in said groove.

6. A camera module provided in a mobile telecommunication handset, said camera module comprising:
   a rotation-enabled camera housing;
   a camera attached to said rotation-enabled camera housing;
   a circuit;
   a connection line connecting said circuit to said camera;
   a cap attached to said rotation-enabled camera housing; and
   a first peg and a second peg formed on said cap to provide a first turning point and a second turning point for said flexible printed circuit board, wherein said flexible printed circuit board is wound around said first and second peas in opposite directions to create a plurality of virtual groundings.

7. The camera module of claim 6, wherein said connection line is wound clockwise around said first peg, and said connection line is wound counterclockwise around said second peg.

8. The camera module of claim 6, wherein said connection line is wound counterclockwise around said first peg, and said connection line is wound clockwise around said second peg.

9. The camera module of claim 7, wherein said connection line comprises a flexible printed circuit board.

10. The camera module of claim 6, wherein said cap further comprises an indicator showing a preferred path around said first and second pegs.

11. The camera module of claim 10, wherein said indicator comprises a groove, in which said connection line is positioned.

12. A mobile communication terminal comprising:
   a first unit comprising a circuit;
   a second unit comprising a rotating camera module; and
   a flexible printed circuit board connecting said circuit to said rotating camera module, said rotating camera module comprising:
   a first peg forming a first turning point for said flexible circuit board to wind around in a first direction, wherein a wound path of said flexible circuit board around said first turning point virtually divides said flexible circuit board into a first region and a second region,
   said first region being defined by a first portion of said flexible circuit board extending from a connection point to said rotating camera module to said first peg,
   said second region being defined by a second portion of said flexible circuit board extending from said first peg to an area above said connection point,
   wherein direction of current in said first region is opposite the direction of the current in said second region, creating a first virtual grounding.

13. The mobile communication terminal of claim 12, wherein said rotating camera module further comprises:
   a second peg forming a second turning point for said flexible circuit board to wind around in a second direction, wherein said wound path of said flexible circuit board around said second turning point virtually divides said flexible circuit board into a third region and a fourth region,
   said third region being defined by a third portion of flexible circuit board extending from said area above said connection point to said second peg,
   said fourth region being defined by a fourth portion of flexible circuit board extending from said second peg to said first unit,
   wherein the direction of the current in said third region line is opposite the direction of the current in said fourth region, creating a second virtual grounding.

* * * * *